(12) United States Patent
Rowling et al.

(10) Patent No.: US 11,500,010 B2
(45) Date of Patent: Nov. 15, 2022

(54) INTEGRATED CIRCUIT WITH CURRENT LIMIT TESTING CIRCUITRY

(71) Applicant: Texas Instruments Incorporated, Dallas, TX (US)

(72) Inventors: William Shane Rowling, Chandler, AZ (US); Paul R. Clark, Gilbert, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/151,022

(22) Filed: Jan. 15, 2021

(65) Prior Publication Data

US 2021/0223306 A1 Jul. 22, 2021

Related U.S. Application Data

(60) Provisional application No. 62/962,547, filed on Jan. 17, 2020.

(51) Int. Cl.
*G01R 31/26* (2020.01)
*G01R 31/28* (2006.01)
*H03K 5/24* (2006.01)

(52) U.S. Cl.
CPC ..... *G01R 31/2621* (2013.01); *G01R 31/2884* (2013.01); *H03K 5/24* (2013.01)

(58) Field of Classification Search
CPC ............ G01R 31/2621; G01R 31/2884; G01R 31/3012; H03K 5/24
USPC .................................. 324/713, 691, 649, 600
See application file for complete search history.

(56) References Cited

U.S. PATENT DOCUMENTS

| | | | |
|---|---|---|---|
| 8,378,672 B2 * | 2/2013 | Bidenbach | G01R 31/2884 324/225 |
| 10,389,375 B1 * | 8/2019 | Fick | H03M 1/145 |
| 2015/0185293 A1 * | 7/2015 | Milano | G01R 33/00 324/252 |
| 2015/0198647 A1 * | 7/2015 | Atwood | G01R 31/2884 324/548 |
| 2018/0059339 A1 * | 3/2018 | Gupta | G02B 6/425 |
| 2018/0151099 A1 * | 5/2018 | Choi | H01L 27/1225 |

* cited by examiner

*Primary Examiner* — Giovanni Astacio-Oquendo
(74) *Attorney, Agent, or Firm* — Ronald O. Neerings; Charles A. Brill; Frank D. Cimino

(57) ABSTRACT

An integrated circuit with a switched signal path and circuitry configured to determine an anticipated specification current through the signal path.

23 Claims, 3 Drawing Sheets

INTEGRATED CIRCUIT WITH CURRENT LIMIT TESTING CIRCUITRY

CROSS-REFERENCE TO RELATED APPLICATION

This application claims priority to, the benefit of the filing date of, and hereby incorporates herein by reference: U.S. Provisional Patent Application No. 62/962,547, entitled "Method For Measuring Accurate Converter Current Limit By Internal Heat Elimination," filed Jan. 17, 2020.

BACKGROUND

The example embodiments relate to integrated circuits (IC singular, ICs plural) and IC testing, and more particularly to ICs including current limit testing circuitry.

IC design may include structural design for testing (DFT) circuitry aspects that facilitate physical testability once the IC is manufactured. DFT circuitry can be one or more nodes or more complex active or passive analog and/or digital devices. Typical DFT circuitry can be enabled or accessed during testing, and disabled or potentially no longer accessible when the IC operates in its nominal, non-testing environment. During testing, additional apparatus such as automated test equipment (ATE) provides input test signals to the IC in test mode, and the ATE captures, measures, and/or analyzes corresponding output signals that result from the input test signals. DFT and ATE testing are common in IC design and production and assist with establishing device specifications, tuning devices to specification, and increasing IC yield and reducing IC failure once ICs are released and implemented in intended device application(s).

ICs manufacturers typically determine and publish parameter specifications for the IC, including the IC operational current limit. The specified current limit characterizes the IC maximum recommended operational current capability, resulting from an IC excitation event, such as a current, voltage, or frequency input signal. One typical production IC test ramps current upward in an IC critical path and accurately measures signal response to evaluate the point at which IC performance degrades or the IC fails. Such testing, however, has drawbacks and limits, particularly if the IC response is not accurately measured. For example, increasing operational current increases operational heat, which reduces testing device reliability and introduces measurement error. As another example, ATE resources have limited capability, which decrease as currents increase.

The prior art sometimes implements mitigation techniques to reduce ramped current testing drawbacks, while still attempting to measure current limits. For example, one mitigation approach tests the IC using a downward scaled current ramp. The operational limit is then derived by multiplying the downward scaled test current by a gain to predict the operational current limit Such an approach, however, produces an inaccurate current limit if the gain scale (or any assumption accompanying it) is inaccurate. As another example, another mitigation approach increases testing speed to reduce the amount of time each current amount, in the current ramp, is applied to the IC. Such an approach, however, tests the IC for relatively shorter testing durations, so measuring the result from each reduced duration can be prone to error because the measured signal may not have time to desirably settle if the IC propagation time is relatively long as compared to the shorter testing duration.

Accordingly, example embodiments are provided below that may improve on certain of the above concepts.

SUMMARY

In one example embodiment, there is an integrated circuit comprising: (i) a signal path configured to conduct path current; (ii) a switching device coupled between a first node and a second node along the signal path; (iii) a comparator having a first input coupled to the first node and a second input coupled to the second node, the comparator configured to receive a reference voltage and compare to the reference voltage a differential voltage between the first input and the second input; (iv) disable circuitry configured to open the switching device while a voltage is applied between the first node and the second node and the voltage is ramped until an output of the comparator transitions; and (v) enable circuitry configured to close the switching device while a device current is applied through the switching device.

Other embodiments and aspects are also disclosed and claimed.

DETAILED DESCRIPTION

Figure 1:
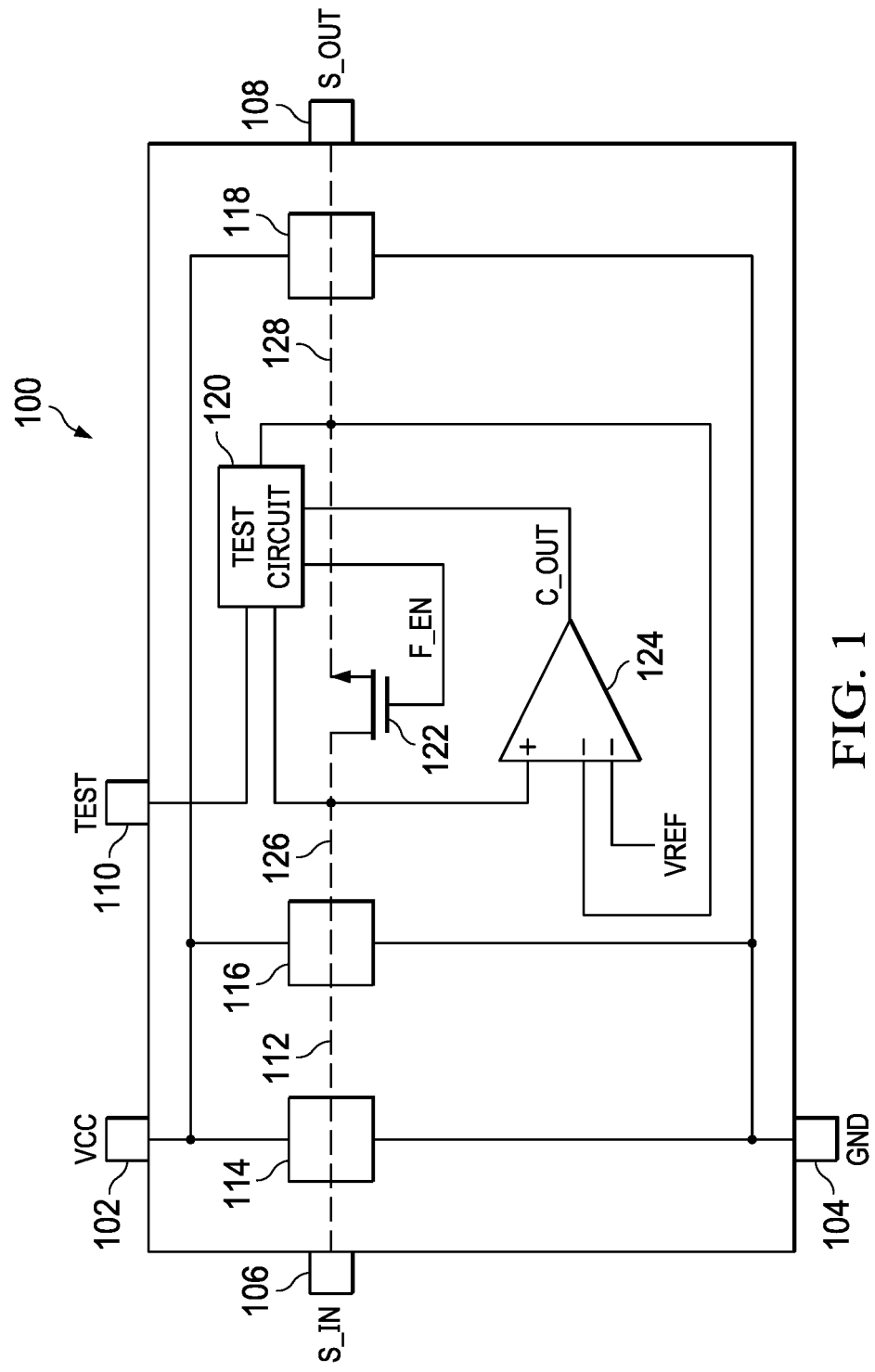
FIG. 1 illustrates a schematic of an example embodiment IC which includes DFT embedded testing circuitry.

FIG. 1 illustrates a schematic of an example embodiment IC 100 which, as detailed below, includes DFT embedded testing circuitry. IC 100 includes five physical pins, sometimes referred to as pads, shown as a first pin 102, a second pin 104, a third pin 106, a fourth pin 108, and a fifth pin 110. Each physical pin is a conductor for providing a signal interface between the IC 100 and an external connection. Example embodiment ICs may have any number of pins. Embodiments with fewer pins (e.g., six or less), however, may favorably facilitate testing the IC 100 using a subset of its pins (which can be as few as one pin), where each pin in the pin subset provides some other respective function during non-testing operations. Such dual-pin use eliminates the need for a dedicated test pin(s), as may be implemented in ICs that have a larger number of pins. The first pin 102 is for receiving a bias voltage VCC, and the second pin 104 is for connecting to a low reference voltage, such as ground (GND). The third pin 106 is for receiving an input signal S_IN, and the fourth pin 108 is for providing an output signal S_OUT, where each of the input and output signals can be of various types, such as voltage, current, or data, depending on the functionality of the IC 100. In general, a signal path 112 exists between the input signal S_IN and the output signal S_OUT. The signal path 112 is illustrated as a dashed line, as it is not necessarily a same node throughout, but represents a general path through blocks that may be connected to different devices and other signal paths.

The fifth pin 110 is associated with a TEST signal, where the fifth pin 110 may be an additional physical pin, an internal test node, or a function that may be enabled as described later. The fifth pin 110, as introduced above, represents either a physical pin or node, providing either internal or external access with or without a pad in the form of other pins, or a functional operation, where in any case an associated TEST signal is asserted. For example, if the fifth pin 110 is a physical dedicated test pin, it can receive an asserted TEST signal. As another example, the fifth pin 110 may represent a physical pin that has one function during not-testing operations and a different function to enable testing during testing operations. Indeed, the fifth pin 110 could be instantiated by the third pin 106 to receive S_IN during non-testing, while during testing either a signal at the third pin 106, either alone or in combination with signaling to one or more other pins, causes circuitry internal to the IC 100 to assert the TEST signal, thereby placing the IC 100 in a condition for testing (e.g., a test mode). Either of these options enables testing of the IC 100, as further detailed below.

The IC 100 includes a number N of functional blocks, which by way of example is shown as N=3 functional blocks 114, 116, and 118. The number N can be selected from a wide range, based on IC implementation, functionality, and testing requirements. By way of example, the signal path 112 is shown passing through each of the functional blocks 114, 116, and 118. Each of the functional blocks 114, 116, and 118 is also biased between VCC and ground. Further, each of the functional blocks 114, 116, and 118 may provide a same or different function, where collectively these blocks (and potentially others, not shown) provide an overall function of the IC 100. Example embodiments include myriad types of ICs, so neither the layout nor the number N of functional blocks 114, 116, 118 is limiting. Instead, each functional block illustrates circuitry and/or connectivity in the IC 100, where the signal path 112 has a testable current limit as further detailed below, and where that limit once determined may provide a basis for the IC specification and/or trimming the IC to operate reliably or safely at or below that limit.

The IC 100 also includes a test circuit 120, a switching device such as a field-effect transistor (FET) 122, and a comparator 124. The test circuit 120 is connected to assist testing, such as in combination with ATE (see FIG. 2), to perform current limit tests of the signal path 112. For example, the test circuit 120 is connected to receive signaling from, and/or provide signaling to, the fifth pin 110 in connection with the TEST signal. The test circuit 120 may be as simple as one or more test nodes, which can be internal and not directly connected to an IC external pad or pin, or it may include additional circuitry to operate in conjunction with ATE signal sequencing, as further appreciated from this document. Specifically, the test circuit 120 is connected to provide a FET enable signal F_EN to the gate of the FET 122 and to receive a comparator output signal C_OUT from the output of the comparator 124. Further, the FET source/drain path is connected along the signal path 112, for example with the FET drain connected to a node 126 and the FET source connected to a node 128, with both nodes 126 and 128 also connected to the test circuit 120. The noninverting input of the comparator 124 is connected to the node 126, and the inverting input of the comparator 124 is connected to the node 128. Accordingly, the comparator differential input (between the nodes 126 and 128) is the voltage across the source-to-drain structure of the FET 122. The comparator 124 also has a reference input connected to a reference voltage VREF. In operation, the comparator 124 compares the differential voltage between nodes 126 and 128 to VREF, with the comparator output signal C_OUT presenting a first state (e.g., a digital low) if the differential voltage between nodes 126 and 128 is less than VREF, and presenting a second state (e.g., a digital high) if the differential voltage between nodes 126 and 128 is greater than VREF. Accordingly a state transition in C_OUT represents an occurrence of the differential voltage input to the comparator 124 exceeding VREF, which as shown later establishes a maximum current limit across the signal path 112 between the nodes 126 and 128. Further, because the comparator output signal C_OUT is connected to the test circuit 120, then comparator output signal C_OUT can be passed through to the fifth pin 110 as the TEST signal, or if the test circuit 120 is, or provides, an internal node, then the comparator output signal C_OUT may be probed either manually or by ATE-controlled apparatus, for example, at that node. Still further, the test circuit 120 may include additional circuitry that can act in response to the state presented by the comparator output signal C_OUT.

Figure 2:
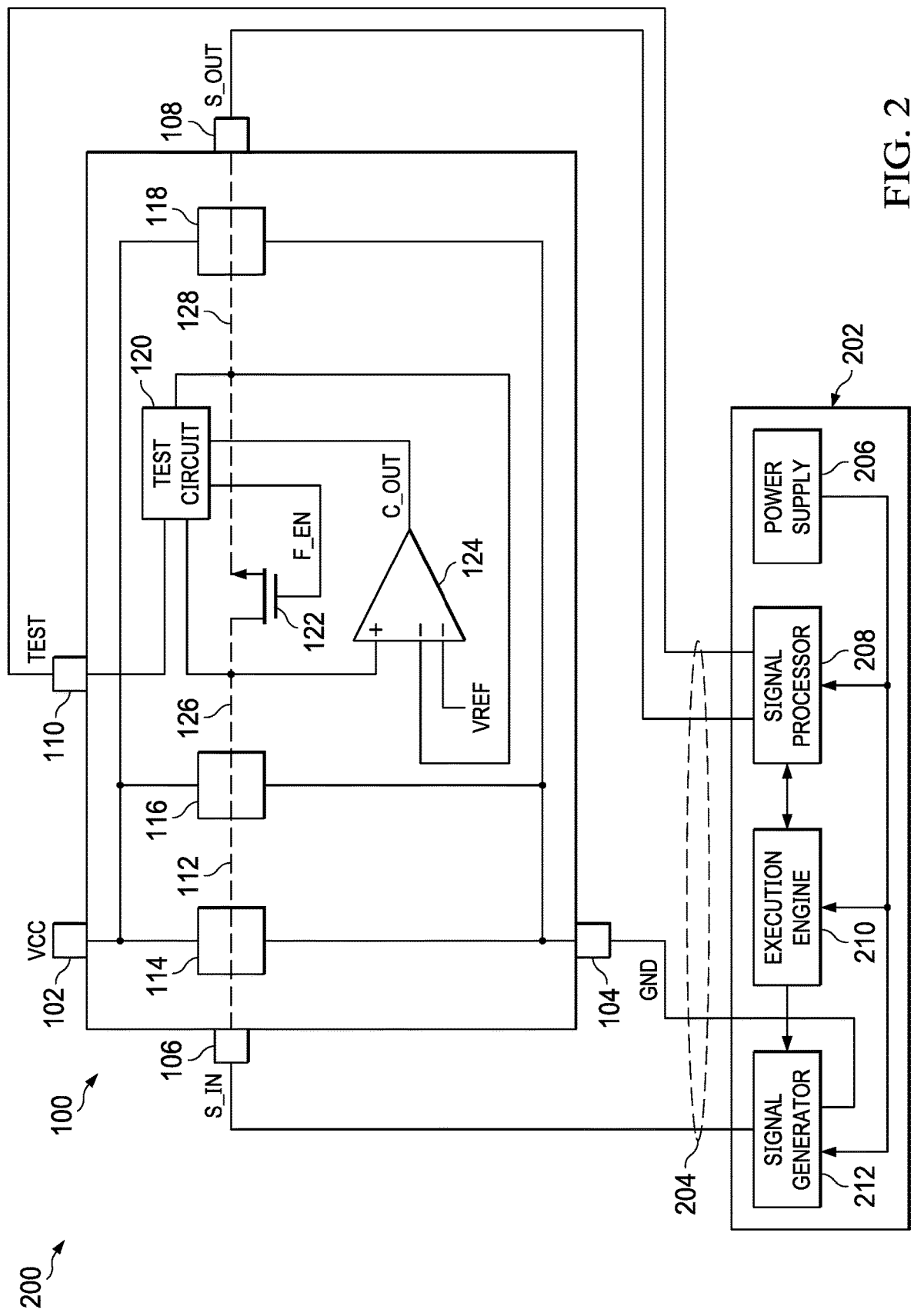
FIG. 2 illustrates a schematic of an example embodiment of an IC testing environment.

FIG. 2 illustrates a schematic of an example embodiment of an IC testing environment 200 for testing the FIG. 1 IC 100. Parts of the testing environment 200 can be embodied, in part or whole, with various commercially-available or developed general-purpose automated test equipment (ATE) 202. For this reason, in FIG. 2, the reference of ATE 202 is generally to various components outside of IC 100, again to contemplate that some of the testing apparatus and method can be part of or facilitated by the ATE 202. Generally, the ATE 202 provides an interface 204 by which the ATE 202 and the IC 100 are connected to each other. Further, the ATE 202 is shown in simplified form to include a power supply 206, a signal processor 208, an execution engine 210, and a signal generator 212. The power supply 206 provides power to the ATE 200 components and also may provide power and/or a ground reference to the IC 100. The execution engine 210 is one or more processing devices, such as a microprocessor and/or digital signal processor (DSP), that can access and execute program instructions stored in a non-transitory computer-readable program storage medium, such as internal or external memory or magnetic media (e.g., hard or flash drive), replaceable storage media, networked media, or the like. Such execution by the execution engine 210 sequences through an IC test program that causes signals to be applied to, and read from, the IC 100. Particularly, the execution engine 210 controls the signal generator 212 to apply signals from one or more of various analog or digital resources, which can provide analog or digital voltage, current, frequency or other signals to the IC 100. Accordingly, the signal generator 210 is connected to provide S_IN to the third pin 106 of the IC 100, and potentially also to provide or read one or more TEST signals to or from the fifth pin 110, and the signal processor 208 also is connected to measure S_OUT from the fourth pin 108.

Figure 3:
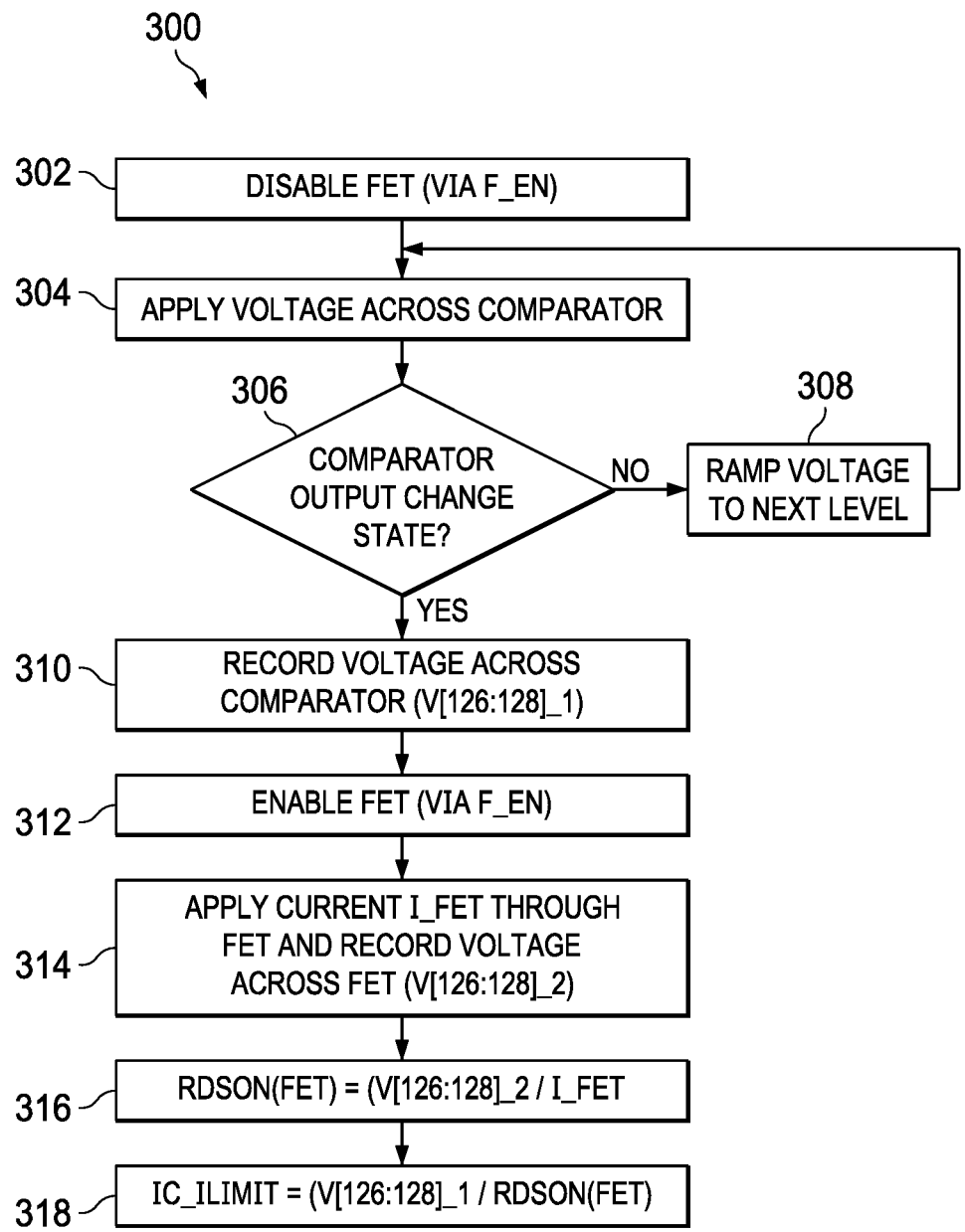
FIG. 3 illustrates a flowchart of an example embodiment method as may be performed by an ATE test program to test the FIG. 1 IC.

FIG. 3 illustrates a flowchart of an example embodiment method 300, as may be performed by an ATE test program executed by the FIG. 2 ATE 202 to test the FIG. 1 IC 100. The method 300 is an example, where teachings of this document also facilitate the addition, deletion, or re-ordering of one or more steps in the method 300. Further, a flowchart is used by way of example as to step sequencing, but other forms (e.g., state diagram) also may be used to demonstrate the flow, from which adequate ATE programming may be provided.

Method 300 starts with a step 302. In the step 302, testing of the IC 100 commences, and the FET 122 is disabled by de-asserting F_EN. For example, the ATE 202 can submit the de-asserted F_EN signal to the test circuit 120, through the fifth pin 110 or as direct probing to a node that is part of the test circuit 120. With the FET 122 disabled, an open circuit is created between the nodes 126 and 128, that is, between the non-inverting and inverting inputs to the comparator 124. Next, the method 300 continues from the step 302 to a step 304.

In the step 304, a first differential voltage level is applied between the nodes 126 and 128, that is, across the non-inverting and inverting inputs to the comparator 124. For example, the ATE 202 can cause the test circuit 120 to apply the differential voltage in response to a TEST signal to the fifth pin 110, or as direct probing from the signal generator 212 to nodes that are part of the test circuit 120 or directly to the nodes 126 and 128. Next, the method 300 continues from the step 304 to a step 306.

The step 306 is a conditional step that determines whether the comparator 124 output, C_OUT, changes state in response to the step 304-applied differential voltage. For example, method 300 will be shown to iteratively apply increasing (ramping) levels of differential voltage to the comparator 124 until C_OUT changes state. Accordingly, the first instance of the step 304 will apply a relatively low voltage, as compared to the expected reference voltage VREF that also is input to the comparator 124. For instance, if VREF is expected to be 12 volts, then the first instance of the step 304 may apply a differential voltage of 10 volts with ramping thereafter at an increment of 60 mV per iteration of the step 304. This incremental value may be selected based on a performance target. For example, for a nominal 12 volt VREF, then a performance target of approximately 0.5% thereof creates the incremental value of 60 mV (12 volts× 0.005=60 mV). The performance target may vary and may be reduced particularly as related technologies advance. If, in the step 306, C_OUT does not change state, then the method 300 continues from the step 306 to a step 308. If, in the step 306, C_OUT changes state, then the method 300 continues from the step 306 to a step 310.

In the step 308, the differential voltage to be applied to the comparator 124 is ramped upward, for example by a same increment for each ramp step, to a next level. Accordingly in the example provided above, a voltage of 60 mV is added to the differential voltage last applied in the step 304, and then method 300 returns to the step 304 so that the step 308 increased differential voltage is applied to the comparator 124.

The step 310 is reached when C_OUT changes state in response to a respective differential voltage applied across the comparator 124, and as shown above that voltage may result from an iteratively ramped voltage starting with an initial voltage applied in the first instance of the step 304. Continuing the earlier example where the nominal expected value of VREF is 12 volts, in an actual testing scenario it may be that VREF deviates from the nominal value, for example to 12.4 volts. In this case, then C_OUT will not change stage until the step 304 applied voltage is at least 12.4 volts. In any event, the transition in state, and to the step 310, causes the ATE 202 to record the voltage that caused the C_OUT transition. The voltage may be recorded, for example, by storing it in a memory that is either part of, or accessible by, the execution engine 210. Also for reference purposes, because that voltage exists between the nodes 126 and 128, it is referred to herein as V[126:128]_1, with the trailing identifier of "_1" indicating this is a first stored voltage in comparison to a second one described later. Next, the method 300 continues from the step 310 to a step 312.

In the step 312, the FET 122 is enabled by asserting F_EN. For example, the ATE 202 can submit the asserted F_EN signal to the test circuit 120, through the fifth pin 110 or as direct probing to a node that is part of the test circuit 120. With the FET 122 enabled, the nodes 126 and 128 are coupled to one another, with the source/drain path of the FET 122 between them. Accordingly, when the FET 122 is enabled, the FET on resistance, referred to as RDSON(FET), is connected between the nodes 126 and 128. Additionally, note that the FET 122 can remain enabled even after testing, so that it forms an ongoing part of the signal path 112 during regular IC operation, remaining on when the IC 100 is in its on (and non-testing) state. Accordingly, the FET source/drain path conducts current along the signal path 112 during non-testing operation of the IC 100, with that current presumably limited to not exceed the maximum specified operating current, as will be determined by the conclusion of the method 300. Next, the method 300 continues from the step 312 to a step 314.

In the step 314, a current I_FET is applied between the nodes 126 and 128 and, consequently, through the source/drain RDSON(FET) resistance of the FET 122. For example, the ATE 202 can cause the test circuit 120 to apply the current in response to a TEST signal to the fifth pin 110, or as direct probing from the signal generator 212 to nodes that are part of the test circuit 120 or directly to the nodes 126 and 128. In an example embodiment, the magnitude of I_FET is relatively low, so as to minimize any negative effect that could arise if I_FET were higher, which would therefore create heat through the current path which could give rise to measurement error. For example, while there is not an absolute limit on I_FET, in an example embodiment the magnitude of I_FET may be ten percent of the anticipated specification current limit, as the ten percent limit is not anticipated to create measuring heating error. Accordingly, for an IC 100 with an anticipated current specification limit of 10 A, then I_FET is 1 A (10 A×0.10=1 A) or less. Further, since the current I_FET passes through the resistance RDSON(FET) between the nodes 126 and 128, then a voltage is formed across that resistance. The step 314 also measures and preferably stores this voltage, which is referred to with a similar convention as in step 310 because the voltage is between the nodes 126 and 128, but here is referred to as V[126:128]_2, with the trailing identifier of "_2" indicating a second voltage measured and recorded between those nodes. Next, the method 300 continues from the step 314 to a step 316.

In the step 316, RDSON(FET) is determined, for example by the ATE 202. Particularly, using Ohms law, RDSON (FET) may be defined, and determined from prior recorded measurements, according to magnitudes of the values shown in the following Equation 1:

$$RDSON(FET) = V[126:128]\_2/I\_FET \qquad \text{Equation 1}$$

Next, the method 300 continues from the step 316 to a step 318.

In the step 318, the current limit for the IC 100, IC_ILIMIT, is determined by the ATE 202 as the ratio of the magnitude of the values shown in the follow Equation 2:

$$IC\_ILIMIT = V[126:128]\_1/RDSON(FET) \qquad \text{Equation 2}$$

Particularly, from Equation 2 and the earlier method 300 steps, ultimately IC_ILIMIT indicates the specification for maximum current through an IC 100 signal path (e.g., along the signal path 112), but that current limit is determined, in part, by opening that path, for example by disabling the FET 122 along the path. This is in contrast to prior art approaches, for example those that ramp current along an IC closed signal path to undesirably large values, potentially inducing heat and introducing measurement error or possible damage to the IC. Instead, the example embodiment uses a measure, V[126:128]_1, from the signal path in an open-circuit form of that path, by voltage-triggering a transition in the comparator 124 coupled across the open path and measuring that trigger voltage, and separately closing the path through a switched resistance (e.g., FET 122) and determining that resistance. From these steps, the path current limit is established as a ratio that indicates the current that, if passing through the closed path, would reach the comparator trigger voltage, rather than determining that current limit by forcing that current (or a scaled version thereof) through the closed-path resistance as part of testing.

From the above, one skilled in the art should appreciate that example embodiments include ICs including current limit testing circuitry. For example, apparatus and methodology embodiments are illustrated for testing an IC (e.g., IC 100) having multiple pins. In an example embodiment, IC testing is achieved by applying increasing voltage levels to nodes in a path to cause a state change, and observing the applied transition-causing-voltage when the change occurs. The testing further determines a current limit for the path as the current, through a resistance for the path, needed to cause the transition-causing-voltage across the resistance. In an example embodiment, the resistance may be determined by applying a test current, below the level of the eventually-determined current limit, across the resistance, with the resistance then determined as the quotient of the voltage across the resistance divided by the test current. As a result, the relatively lower test current, as compared to the eventually-determined current limit, provides lesser heat during testing and reduces or avoids potential drawbacks in some prior art current limit testing. Further, having reduced or eliminated the heating drawback of traditional testing, the example embodiment IC 100 can be tested by setting it to a static state, such that propagation time is eliminated from the measurement. The static state of the IC and the elimination of the heating error allow for the ATE to execute at a much slower speed that resolves to a more accurate measurement. Further, IC value is enhanced in providing a more accurate device specification, which can reduce customer cost in avoiding having to couple to the IC other devices (e.g., inductors) that would add to costs if having to accommodate a less accurate device specification. Still further, variations have been shown and others may be ascertained given the teachings of this document. For example, testing has been shown with a combination of an ATE and test circuitry on the IC, which test circuitry can include one or more probe nodes or may include additional circuitry, for example for opening and closing the current path, such as by enabling and disabling a FET in the path. As another example, the IC modifications and testing may be implemented in many different types of ICs. These and others will be appreciated or ascertainable by one skilled in the art, in view of the teachings of this document. Accordingly, additional modifications are possible in the described embodiments, and other embodiments are possible, within the scope of the following claims.

What is claimed is:

1. An integrated circuit, comprising:
    a signal path configured to conduct path current;
    a switching device coupled between a first node and a second node along the signal path;
    a comparator having a first input coupled to the first node and a second input coupled to the second node, the comparator configured to receive a reference voltage and to compare to the reference voltage a differential voltage between the first input and the second input;
    disable circuitry configured to open the switching device while a voltage is applied between the first node and the second node and the voltage is ramped until an output of the comparator transitions; and
    enable circuitry configured to close the switching device while a device current is applied through the switching device.

2. The integrated circuit of claim 1 wherein the disable circuitry configured to open the switching device is configured to open the switching device only during testing of the integrated circuit.

3. The integrated circuit of claim 1 wherein the switching device comprises a field effect transistor.

4. The integrated circuit of claim 3 wherein the disable circuitry configured to open the switching device and the enable circuitry configured to close the switching device include a node configured to couple to automated test equipment to receive a field effect gate signal from the automated test equipment.

5. The integrated circuit of claim 1 wherein the disable circuitry configured to open the switching device and the enable circuitry configured to close the switching device include a node configured to couple to automated test equipment to receive a switch enable and switch disable signal.

6. The integrated circuit of claim 5 wherein the node is internal to the integrated circuit and not directly connected to an IC external pad.

7. The integrated circuit of claim 1 and further including automated test equipment configured to couple to the integrated circuit and to determine a maximum current specification for the path current in response to a measure of the voltage level that causes the output of the comparator to transition and a measure of a resistance of the switching device.

8. The integrated circuit of claim 7 wherein the automated test equipment is further configured to determine resistance of the switching device.

9. The integrated circuit of claim 7 wherein the automated test equipment is further configured to:
    measure a voltage across the switching device while the device current is applied through the switching device; and
    determine resistance of the switching device in response to a ratio of the measured voltage and a magnitude of the device current.

10. The integrated circuit of claim 1 and further including a plurality of functional circuits coupled to signal path.

11. The integrated circuit of claim 1 wherein the disable circuitry and the enable circuitry comprise a same circuit.

12. A method, comprising:
    operating an integrated circuit during a test mode by creating an open circuit between a first node and a second node that are both along a signal path of the integrated circuit during non-test mode operations;
    with the open circuit, iteratively applying a respectively adjusted differential voltage between the first node and the second node until a responsive state change occurs in response to a corresponding respectively adjusted differential voltage;
    coupling a resistance between the first node and the second node;
    with the resistance between the first node and the second node, applying a current through the resistance and measuring a voltage across the resistance;
    determining in an apparatus a value of the resistance in response to the corresponding respectively adjusted differential voltage and the current; and determining in the apparatus an anticipated specification current limit for the signal path of the integrated circuit in response to the corresponding respectively adjusted differential voltage and the determined resistance.

13. The method of claim 12 wherein the step that includes creating an open circuit includes disabling a field effect transistor having a source/drain path between the first node and the second node.

14. The method of claim 12 wherein the responsive state change is provided in response to an output of a differential comparator having a first input coupled to the first node and a second input coupled to the second node.

15. The method of claim 12:
wherein the step that includes creating an open circuit includes disabling a field effect transistor having a source/drain path between the first node and the second node; and
wherein the responsive state change is provided in response to an output of a differential comparator on the integrated circuit and having a first input coupled to the first node and a second input coupled to the second node.

16. The method of claim 12 wherein the step of, with the resistance between the first node and the second node, applying a current through the resistance includes applying a current no greater than ten percent of the anticipated specification current limit.

17. The method of claim 12 wherein the apparatus is coupled to the integrated circuit.

18. The method of claim 17 wherein the apparatus is an automated test equipment (ATE).

19. A non-transitory computer-readable program storage medium having stored thereon program instructions that when executed by processing logic have the processing logic configured to:
couple a test signal to an integrated circuit during a test mode to create an open circuit between a first node and a second node that are both along a signal path of the integrated circuit during non-test mode operations;
with the open circuit, iteratively apply a respectively adjusted differential voltage between the first node and the second node until a responsive state change occurs in response to a corresponding respectively adjusted differential voltage;
enable a resistance between the first node and the second node;
with the resistance enabled between the first node and the second node, apply a resistance current through the resistance and measure a voltage across the resistance;
determine a value of the resistance in response to the corresponding respectively adjusted differential voltage and the resistance current; and
determine an anticipated specification current limit for the signal path of the integrated circuit in response to the corresponding respectively adjusted differential voltage and the determined resistance.

20. The non-transitory computer-readable program storage medium of claim 19 wherein the test signal coupled to an integrated circuit is for coupling to a gate of a field effect transistor having a source/drain path between the first node and the second node.

21. The non-transitory computer-readable program storage medium of claim 19 wherein the iteratively applied respectively adjusted differential voltage is coupled between inputs of a comparator and the responsive state occurs at an output of the comparator.

22. The non-transitory computer-readable program storage medium of claim 19:
wherein the test signal coupled to an integrated circuit is for coupling to a gate of a field effect transistor having a source/drain path between the first node and the second node; and
wherein the iteratively applied respectively adjusted differential voltage is coupled between inputs of a comparator and the responsive state occurs at an output of the comparator.

23. The non-transitory computer-readable program storage medium of claim 19 wherein the applied resistance current is no greater than ten percent of the anticipated specification current limit.

* * * * *